United States Patent

Mandell et al.

[11] Patent Number: 6,077,303
[45] Date of Patent: Jun. 20, 2000

[54] ARCHITECTURAL EQUATION GENERATING ALGORITHM

[75] Inventors: Michael I. Mandell; Arnold L. Berman, both of Los Angeles; Wei-Chun Wang, Temple City; Tong-Jyh Lee, Hermosa Beach, all of Calif.

[73] Assignee: Hughes Electronics Corporation, El Segundo, Calif.

[21] Appl. No.: 09/067,216

[22] Filed: Apr. 28, 1998

[51] Int. Cl.[7] .................................................. G06F 17/50
[52] U.S. Cl. .................................................. 703/14; 703/26
[58] Field of Search ........................... 395/500.23, 500.4, 395/564, 555, 556, 558; 364/FOR 578; 703/14, 17, 26; 714/703

[56] References Cited

U.S. PATENT DOCUMENTS

| | | | |
|---|---|---|---|
| 5,105,373 | 4/1992 | Rumsey et al. | 364/578 |
| 5,404,319 | 4/1995 | Smith et al. | 364/578 |
| 5,408,638 | 4/1995 | Sagawa et al. | 395/500 |
| 5,410,719 | 4/1995 | Shackleford | 395/800 |

*Primary Examiner*—Kevin J. Teska
*Assistant Examiner*—Thai Phan
*Attorney, Agent, or Firm*—T. Gudmestad; M. W. Sales

[57] ABSTRACT

An algorithm (20) or method (20) for verifying that a system hierarchically built from smaller components implements a desired equation that represents the system. Symbolic data is clocked (24) through the system by processing a symbolic test vector using linked equations (22) written (21) for each component of the system. A resulting symbolic equation generated at the output of the system is recorded (25). The symbolic equation is then compared (26) with the desired equation for the system using a symbolic manipulation tool. If the comparison generates a zero difference, the system correctly implements the desired equation representative of the system, and vice-versa.

1 Claim, 3 Drawing Sheets

THREE STAGE PIPELINE MULTIPLIER

INSTANTANEOUS MULTIPLIER

```
┌─────────────────────────────────────────────┐
│ WRITING AN EQUATION FOR EACH COMPONENT OF   │─ 21
│ THE SYSTEM IN TERMS OF ITS INPUTS AND       │
│ OUTPUTS THAT REPRESENTS THE OPERATION       │
│ EXECUTED BY EACH COMPONENT                  │
└─────────────────────────────────────────────┘
                      ↓
┌─────────────────────────────────────────────┐
│ MATHEMATICALLY LINKING THE RESPECTIVE       │─ 22
│ EQUATIONS TOGETHER ACCORDING TO THE         │
│ SYSTEM HIERARCHY                            │
└─────────────────────────────────────────────┘
                      ↓
┌─────────────────────────────────────────────┐
│ APPLYING A SYMBOLIC TEST VECTOR TO THE      │─ 23
│ MATHEMATICALLY LINKED EQUATIONS             │
└─────────────────────────────────────────────┘
                      ↓
┌─────────────────────────────────────────────┐
│ CLOCKING THE SYMBOLIC TEST VECTOR           │─ 24
│ THROUGH THE MATHEMATICALLY LINKED           │
│ EQUATIONS TO GENERATE A SYMBOLIC EQUATION   │
│ AT THE OUTPUT THEREOF                       │
└─────────────────────────────────────────────┘
                      ↓
┌─────────────────────────────────────────────┐
│ RECORDING THE SYMBOLIC EQUATION             │─ 25
│ GENERATED AT THE OUTPUT OF THE              │
│ MATHEMATICALLY LINKED EQUATIONS             │
└─────────────────────────────────────────────┘
                      ↓
┌─────────────────────────────────────────────┐
│ COMPARING THE SYMBOLIC EQUATION WITH AN     │─ 26
│ EQUATION THAT CORRECTLY REPRESENTS THE      │
│ SYSTEM USING A SYMBOLIC MANIPULATION TOOL   │
└─────────────────────────────────────────────┘
```

ARCHITECTURAL EQUATION GENERATING ALGORITHM

BACKGROUND

The present invention relates generally to methods for testing electronic systems, and more particularly, to an architectural equation generating algorithm or method for testing whether a system that is hierarchically built from smaller blocks correctly implements a desired equation.

The standard method used for verifying that a system that is hierarchically built from smaller blocks correctly implements a desired equation is to simulate numeric test vectors through the system. There are several shortcomings to this approach. First, for even very small simple systems, it is practically impossible to exhaustively simulate all possible inputs to the system. Second, if a particular test vector input to the system produces an incorrect output, it is difficult to use this incorrect output to pinpoint the error in the design.

Accordingly, it is an objective of the present invention to provide for an architectural equation generating algorithm or method for testing whether a system that is built hierarchically from smaller blocks correctly implements a desired equation.

SUMMARY OF THE INVENTION

To accomplish the above and other objectives, the present invention provides for an algorithm or method for verifying that a system hierarchically built from smaller blocks (components) implements a desired equation that correctly represents the system. This is done by adding a path for symbolic data to be clocked through the system (wherein an additional path is added into the system simulation) and printing the resulting symbolic equation at the output of the system. This symbolic equation is then compared with the desired equation using a software tool capable of symbolic manipulation such as Mathcad, or Mathematica, for example.

More particularly, using the present invention, an equation (string variable) is written for each component of the system in terms of its inputs and outputs that represents the operation executed by each component. The respective equations are then mathematically linked together according to the system hierarchy. A symbolic test vector is then input to the mathematically linked equations. The symbolic test vector is clocked through the system and the resulting symbolic equations generated at the outputs of the system are recorded.

Thus, the symbolic test vector is operated on by each successive equation of the mathematically represented system hierarchy, which ultimately produces the symbolic equation at the output. This symbolic equation is then compared with the desired equation for the system using a symbolic manipulation tool.

By using the symbolic approach of the present invention, it is only necessary to apply a single symbolic test vector to exhaustively test all possible inputs to the system. Furthermore, if the system produces an incorrect equation at the output, by comparing the terms of the equation at the output with the desired equation, a system designer has a means of finding the error in the design. The present algorithm is especially useful in cases where control circuitry is used to share resources in a design.

The present invention thus provides an indication to a system designer that a particular circuit implementation is correctly constructed. Furthermore, if a particular implementation is not correctly constructed, the present invention produces an equation that will aid the system designer to quickly debug the problem.

The present algorithm is specifically intended to use in an Application Specific Integrated Circuit (ASIC) design process where larger designs are hierarchically built up from smaller blocks such as adders, multipliers, and register delays. This is applicable to all signal processing programs. The present invention significantly reduces the labor required to produce a VHDL description of an ASIC. This decrease in labor results in a corresponding decrease in schedule times and labor costs.

BRIEF DESCRIPTION OF THE DRAWINGS

The various features and advantages of the present invention may be more readily understood with reference to the following detailed description taken in conjunction with the accompanying drawing figures, wherein like reference numerals designate like structural elements, and in which:

FIG. 1b illustrates an electronic representation of the three-stage pipeline multiplier of FIG. 1a;

FIG. 3 is a flow chart illustrating an exemplary embodiment of the present invention.

DETAILED DESCRIPTION

The algorithm of the present invention implicitly assumes that all smaller blocks used to build up a hierarchical design of a system have been fully tested and function correctly. The algorithm is used to create string variables associated with each variable (component) in the system. This algorithm may be used in any simulation environment that supports string variables. This includes VHDL, C, FORTRAN, and almost every programming language that exists.

For each component in the system the outputs thereof are written as an equation formed from the input strings. For example, for a two input multiplier the output string is formed by placing parenthesis around the input strings and placing the character "*" between them. For hierarchical blocks with memory, such as a register delay, internal string variables are created as needed. For the case of a single register delay, the input string is written to the internal string, then on the next clock cycle the internal string is written to the output string and the next input string is written to the internal string. To keep track of dependencies among signals in a design, special character strings can be created to represent uninitialized or unknown states.

Figure 1A:
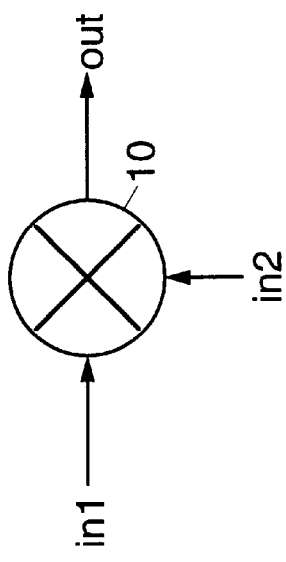
FIG. 1a illustrates a three-stage pipeline multiplier useful in illustrating the principles of the present invention.
Figure 1B:
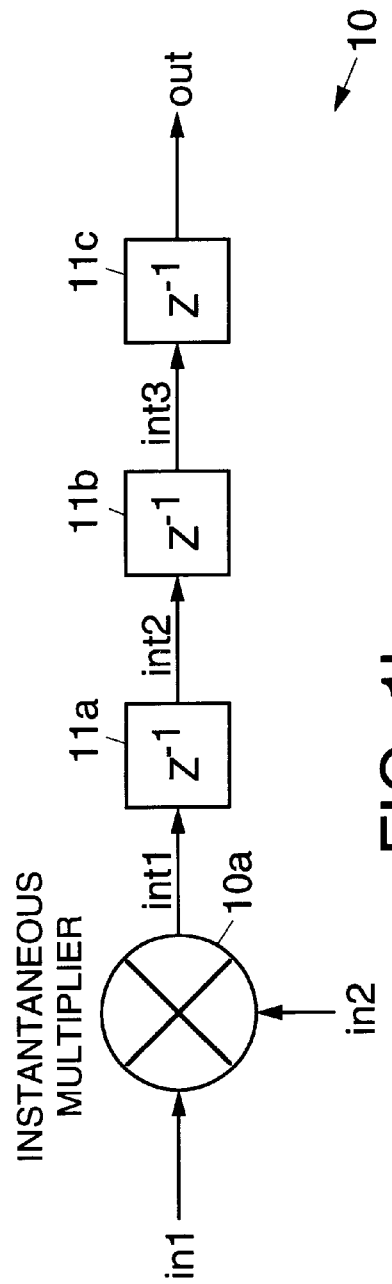

Referring to the drawing figures, FIG. 1a shows an example of an exemplary three-stage pipeline multiplier 10 that may be tested using the architectural equation generating algorithm of the present invention. The three-stage pipeline multiplier 10 has first and second inputs (in1, in2) and an output (out). The three-stage pipeline multiplier 10 is functionally equivalent to an instantaneous multiplier 10a followed by three register delays 11a, 11b, 11c, as is shown in FIG. 1b. The instantaneous multiplier 10a has first and second inputs (in1, in2) and an output (int1) with the last register delay 11c providing the output (out) of the multiplier 10.

The corresponding C code that represents string variables associated with the above-described multiplier 10 is given immediately below. In this implementation the string "x" represents an unknown state.

```
/* Declarations */
char str_in1[MAXSTRLEN]
char str_in2[MAXSTRLEN]
char str_int1[MAXSTRLEN]
char str_int2[MAXSTRLEN]
char str_int3[MAXSTRLEN]
char str_out[MAXSTRLEN]
/* Code for execution */
sprintf(str_out, "%s", str_int3);
sprintf(str_int3, "%s", str_int2);
sprintf(str_int2, "%s", str_int1);
if((strcmp(str_in1,"x") == 0) 11 (strcmp(str_in2,"x")==0))
{ sprintf(str_int1, "%s", "x"); }
else
{ sprintf(str_int1, "(%s) * (%s)", str_in1, str_in2); }
```

In accordance with the present algorithm, a system built up from hierarchical blocks (components) may be simulated by providing strings at the inputs of the system and printing (or otherwise outputting or storing) the resulting equations generated at the output of the system. The resulting strings at the output are verified for correctness by comparing them to the desired equations for the system using a symbolic mathematics tool such as Mathcad available from MathSoft, Inc., Cambridge, Mass., or Mathematica available from Wolfram Research, Champaign, Ill.

Figure 2:
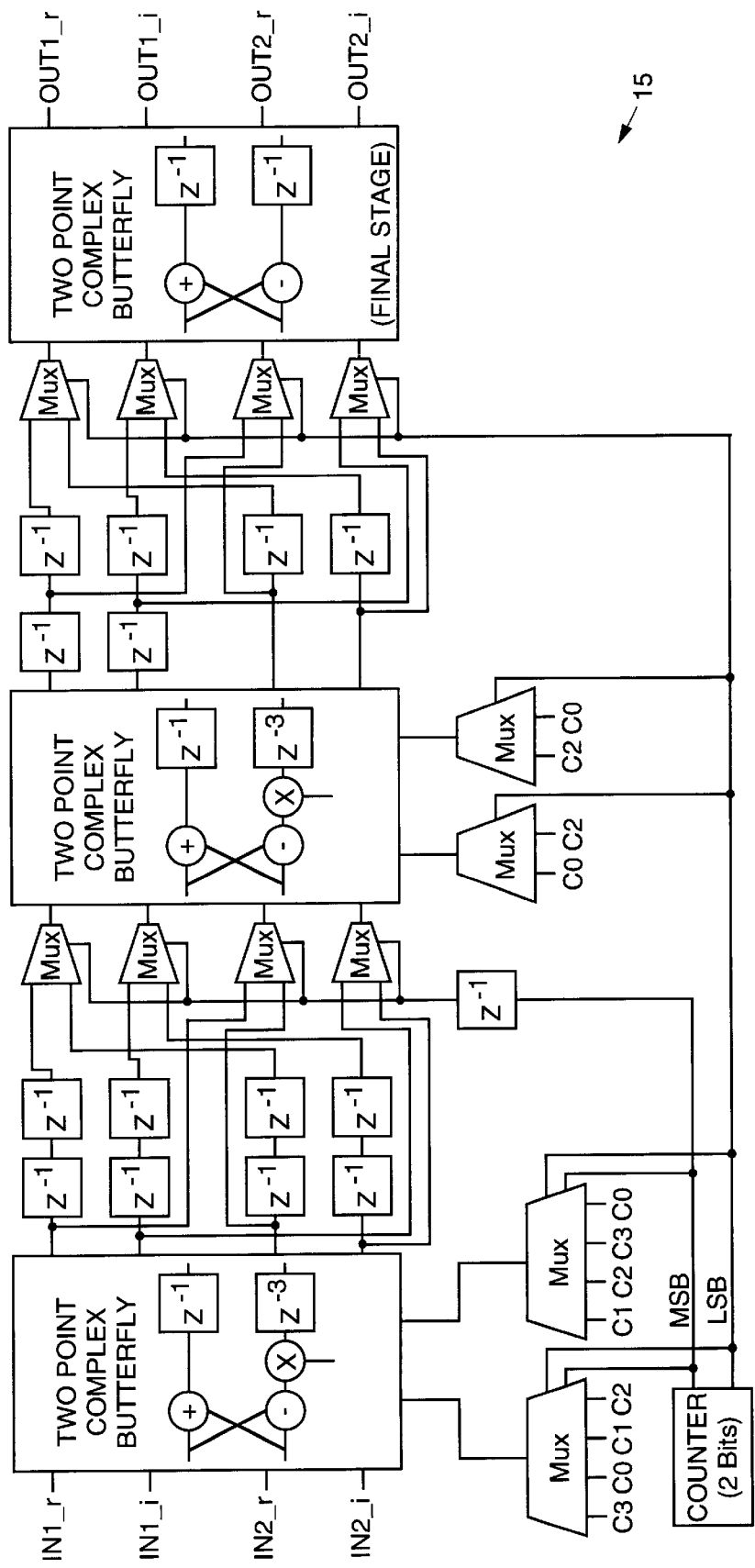
FIG. 2 illustrates an eight-point complex fast Fourier transform which may be tested using an architectural equation generating algorithm in accordance with the principles of the present invention.

FIG. 2 shows an implementation of an eight-point complex fast Fourier transform (FFT) 15 that may be drawn using a software package known as "SPW" available from Cadence. The FFT 15 is well known to those skilled in the art and its construction will not be discussed in detail. The FFT 15 is designed to read from four serial input ports (IN1_r, IN1_i, IN2_r, IN2_i) and write to four serial output ports (OUT1_r, OUT1_i, OUT2_r, OUT2_i) on each clock cycle. The FFT 15 operates in a continuous pipelined fashion. Since four ports corresponds to two complex numbers, a single eight point complex FFT is performed every four clock cycles. The equation of a complex eight-point FFT corresponding to the FFT 15 of FIG. 2 is $$y_k = \sum_{n=0}^{7} x_n e^{(j2\pi nk)/8}.$$

This implementation is designed to read the $x_n$'s and write the corresponding $y_k$'s according to the schedule shown in Table 1.

TABLE 1

| CLOCK CYCLE | IN1 | IN2 | OUT1 | OUT2 |
| --- | --- | --- | --- | --- |
| 0 | x[0] | x[4] | — | — |
| 1 | x[1] | x[5] | — | — |
| 2 | x[2] | x[6] | — | — |
| 3 | x[3] | x[7] | — | — |
| 4 | — | — | — | — |
| 5 | — | — | — | — |
| 6 | — | — | — | — |
| 7 | — | — | y[0] | y[4] |
| 8 | — | — | y[2] | y[6] |
| 9 | — | — | y[1] | y[5] |
| 10 | — | — | y[3] | y[7] |

This symbolic simulation was performed in C code for this implementation of the complex FFT 15 and produced the output equations shown immediately below.

c[0]=1 c[1]=0.710938 c[3]=0.710938 c[2]=0

CLOCK CYCLE=7

$ysi[4]=(((xi[(0)])+(xi[(4)]))+((xi[(2)])+(xi[(6)])))-(((xi[(1)])+(xi[(5)]))+((xi[(3)])+(xi[(7)])))$ $ysr[4]=(((xr[(0)])+(xr[(4)]))+((xr[(2)])+(xr[(6)])))-(((xr[(1)])+(xr[(5)]))+((xr[(3)])+(ir[(7)])))$ $ysi[0]=(((xi[(0)])+(xi[(4)]))+((xi[(2)])+(xi[(6)])))+(((xi[(1)])+(xi[(5)]))+((xi[(3)])+(xi[(7)])))$ $ysr[0]=(((xr[(0)])+(xr[(4)]))+((xr[(2)])+(xr[(6)])))+(((xr[(1)])+(xr[(5)]))+((xr[(3)])+(xr[(7)])))$

CLOCK CYCLE=8

$ysi[6]=(((((xr[(0)])+(xr[(4)]))-((xr[(2)])+(xr[(6)])))*(c[2]))+((((xi[(0)])+(xi[(4)]))-((xi[(2)])+(xi[(6)])))*(c[0])))-(((((xr[(1)])+(xr[(S)]))-((xr[(3)])+(xr[(7)])))*(c[0]))+((((xi[(1)])+(xi[(5)]))-((xi[(3)])+(xi[(7)])))*(c[2])))$ $ysr[6]=(((((xr[(0)])+(xr[(4)])((-((xr[(2)])+(xr[(6)])))*(c[0]))-((((xi[(0)])+(xi[(4)]))-((xi[(6)])))*(c[2])))-(((((xr[(1)])+(xr[(5)]))-((xr[(3)])+(xr[(7)])))*(c[2]))-((((xi[(1)])+(xi[(5)]))-((xi[(3)])+(xi[(7)])))*(c[0])))$ $ysi[2]=(((((xr[(0)])+(xr[(4)]))-((xr[(2)])+(xr[(6)])))*(c[2]))+((((xi[(0)])+(xi[(4)]))-((xi[(2)])+(xi[(6)])))*(c[0])))+(((((xr[(1)])+(xr[(S)]))-((xr[(3)])+(xr[(7)])))*(c[0]))+((((xi[(1)])+(xi[(5)]))-((xi[(3)])+(xi[(7)])))*(c[2])))$ $ysr[2]=(((((xr[(0)])+(xr[(4)]))-((xr[(2)])+(xr[(6)])))*(c[0]))-((((xi[(0)])+(xi[(4)]))-((xi[(2)])+(xi[(6)])))*(c[2])))+(((((xr[(1)])+(xr[(S)]))-((xr[(3)])+(xr[(7)])))*(c[2]))-((((xi[(1)])+(xi[(S)]))-((xi[(3)])+(xi[(7)])))*(c[0])))$

CLOCK CYCLE=9

$ysi[5]=(((((xr[(0)])-(xr[(4)]))*(c[2]))+(((xi[(0)])-(xi[(4)]))*(c[0])))+((((xr[(2)])-(xr[(6)]))*(c[0]))+(((xi[(2)])-(xi[(6)]))*(c[2]))))-((((((xr[(1)])-(xr[(5)]))*(c[1]))+(((xi[(1)])-(xi[(5)]))*(c[1])))+((((xr[(3)])-(xr[(7)]))*(c[1]))+(((xi[(3)])-(xi[(7)]))*(c[3]))))$ $ysr[5]=(((((xr[(0)])-(xr[(4)]))*(c[0]))-(((xi[(0)])-(xi[(4)]))*(c[2])))+((((xr[(2)])-(xr[(6)]))*(c[2]))-(((xi[(2)])-(xi[(6)]))*(c0)))))-((((((xr[(1)])-(xr[(5)]))*(c[1]))-(((xi[(1)])-(xi[(5)]))*(c[1])))+((((xr[(3)])-(xr[(7)]))*(c[3]))-(((xi[(3)])-(xi[(7)]))*(c[1 ))))$ $ysi[1]=(((((xr[(0)])-(xr[(4)]))*(c[2]))+(((xi[(0)])-(xi[(4)]))*(c[0])))+((((xr[(2)])-(xr[(6)]))*(c[0]))+(((xi(2))-(xi[(6)]))*(c[2]))))+((((((xr[(1)])-(xr[(5)]))*(c[1]))+(((xi[(1)])-(xi[(5)]))*(c[1])))+((((xr[(3)])-(xr[(7)]))*(c[1]))+(((xi[(3)])-(xi[(7)]))*(c[3]))))$ $ysr[1]=(((((xr[(0)])-(xr[(4)]))*(c[0]))-(((xi[(0)])(-(xi[(4)]))*(c[2])))+((((xr[(2)])-(xr[(6)]))*(c[2]))-(((xi[(2)])-(xi[(6)]))*(c[0]))))+((((((xr[(1)])-(xr[(5)]))*(c[1]))-(((xi[(1)])-(xi[(5)]))*(c[1])))+((((xr[(3)])-(xr[(7)]))*(c[3]))-(((xi[(3)])-(xi[(7)]))*(c[1]))))$

CLOCK CYCLE=10

$ysi[7]=(((((((xr[(0)])-(xr[(4)]))*(c[0]))-(((xi[(0)])-(xi[(4)]))*(c[2])))-((((xr[(2)])-(xr[(6)]))*(c[2]))-(((xi[(2)])-(xi[(6)]))*(c[0]))))*(c[2])) +((((((xr[(0)])-(xr[(4)]))*(c[2]))+(((xi[(0)])-(xi[(4)]))*(c[0])))-((((xr[(2)])-(xr[(6)]))*(c[0]))+(((xi[(2)])-(xi[(6)]))*(c[2]))))*(c[0]))) -(((((((xr$ $[(1)])-(xr[(5)]))*(c[1]))-(((xi[(1)])-(xi[(5)]))*(c[1])))-((((xr[(3)])-(xr[(7)]))*(c[3]))-(((xi[(3)])-(xi[(7)]))*(c[1]))))*(c[0])) +((((((xr[(1)])-(xr[(5)]))*(c[1]))+(((xi[(1)])-(xi[(5)]))*(c[1])))-((((xr[(3)])-(xr[(7)]))*(c[1]))+(((xi[(3)])-(xi[(7)]))*(c[3])))*(c[2])))$ $ysr[7]=((((((xr[(0)])-(xr[(4)]))*(c[0]))*(c[0]))-(((xi[(0)])-(xi[(4)]))*(c[2])))-((((xr[(2)])-(xr[(6)]))*(c[2]))-(((xi[(2)])-(xi[(6)]))*(c[0]))))*(c[0]))-((((((xr[(0)])-(xr[(4)]))-(xr[(4)]))*(c[2]))+(((xi[(0)])-(xi[(4)]))*(c[0])))-((((xr[(2)])-(xr[(6)]))*(c[0]))+(((xi[(2)])-(xi[(6)]))*(c[2]))))*(c[2]))-((((((xr[(1)])-(xr[(5)]))*(c[1]))-(((xi[(1)])-(xi[(5)]))*(c[1])))-((((xr[(3)])-(xr[(7)]))*(c[3]))-(((xi[(3)])-(xi[(7)]))*(c[1]))))*(c[2]))-((((((xr[(1)])-(xr[(5)]))*(c[1]))+(((xi[(1)])-(xi[(5)]))*(c[1])))-((((xr[(3)])-(xr[(7)]))*(c[1]))$ $ysi[3]=(((((((xr[(0)])-(xr[(4)]))*(c[0]))-(((xi[(0)])-(xi[(4)]))*(c[2])))-((((xr[(2)])-(xr[(6)]))*(c[2]))-(((xi[(2)])-(xi[(6)]))*(c[0]))))*(c[2])+((((((xr[(0)])-(xr[(4)]))*(c[2]))+(((xi[(0)])-(xi[(4)]))*(c[0])))-((((xr[(2)])-(xr[(6)]))*(c[0]))+(((xi[(2)])-(xi[(6)]))*(c[2]))))*(c[0])) +((((((xr[(1)])-(xr[(5)]))*(c[1]))-(((xi[(1)])-(xi[(5)]))*(c[1])))-((((xr[(3)])-(xr[(7)]))*(c[3]))-(((xi[(3)])-(xi[(7)]))*(c[1]))))*(c[0])) +((((((xr[(1)])-(xr[(5)]))*(c[1]))+(((xi[(1)])-(xi[(5)]))*(c[1])))-((((xr[(3)])-(xr[(7)]))*(c[1]))+(((xi[(3)])-(xi[(7)]))*(c[3]))))*(c[2])))$ $ysr[3]=(((((((xr[(0)])-(xr[(4)]))*(c[0]))-(((xi[(0)])-(xi[(4)]))*(c[2])))-((((xr[(2)])-(xr[(6)]))*(c[2]))-(((xi[(2)])-(xi[(6)]))*(c[0]))))*(c[0])-((((((xr[(0)])-(xr[(4)]))*(c[2]))+(((xi[(0)])-(xi[(4)]))*(c[0])))-((((xr[(2)])-(xr[(6)]))*(c[0]))+(((xi[(2)])-(xi[(6)]))*(c[2]))))*(c[2])) +((((((xr[(1)])-(xr[(5)]))*(c[1]))-(((xi[(1)])-(xi[(5)]))*(c[1])))-((((xr[(3)])-(xr[(7)]))*(c[3]))-(((xi[(3)])-(xi[(7)]))*(c[1]))))*(c[2])-((((((xr[(1)])-(xr[(5)]))*(c[1]))+(((xi[(1)])-(xi[(5)]))*(c[1])))-((((xr[(3)])-(xr[(7)]))*(c[1]))+(((xi[(3)])-(xi[(7)]))*(c[3]))))*(c[0])))$ Finally, presented below is a Mathematica analysis where the equation of the complex FFT 15 is defined, and the equations from the simulation given above are also defined. The respective equations are subtracted by the Mathematica program and shown to give a difference of zero for each FFT output, which indicates that the FFT 15, which has been hierarchically built from smaller blocks, correctly implements the desired equation for the FFT 15.

"Theory"

In[17]:=M=8;

ytr[$n_{13}$]:=Sum[xr[k]Cos[(2 Pi k n)/M]-xi[k]Sin[(2 Pi k n)/M], {k, O, M-1}];

yti[$n_{13}$]:=Sum[xr[k]Sin[(2 Pi k n)/M]+xi[k]Cos[(2 Pi k n)/M], {k, O, M-1}];

"Simulation"

c[0]=1;

c[1]=Cos[Pi/4];

c[2]=0;

c[3]=-Cos[Pi/4];

In[1]=ysi[4]=(((xi[(0)])+(xi[(4)]))+((xi[(2)])+(xi[(6)])))-(((xi[(1)])+(xi[(5)]))+((xi[(3)])+(xi[(7)]))); ysr[4]=(((xr[(0)])+(xr[(4)]))+((xr[(2)])+(xr[(6)])))-9(((xr[(1)])+(xr[(5)]))+((xr[(3)])+(xr[(7)]))); ysi[0]=(((xi[(0)])+(xi[(4)]))+((xi[(2)])+(xi[(6)])))+(((xi[(1)])+(xi[(5)]))+((xi[(3)])+(xi[(7)]))); ysr[0]=(((xr[(0)])+(xr[(4)]))+((xr[(2)])+(xr[(6)])))+(((xr[(1)])+(xr[(5)]))+((xr[(3)])+(xr[(7)])));

$ysi[6]=(((((xr[(0)])+(xr[(4)]))-((xr[92)])+(xr[(6)])))*(c[2]))+((((xi[(0)])+(xi[(4)]))-((xi[(2)])+(xi[(6)])))*(c[0])))-(((((xr[(1)])+(xr[(5)]))-((xr[(3)])+(xr[(7)])))*(c[0]))+((((xi[(1)])+(xi[(5)]))-((xi[(3)])+(xi[(7)])))*(c[2])));$ $ysr[6]=(((((xr[(0)])+(xr[(4)]))-((xr[(2)])+(xr[(6)])))*(c[0]))-((((xi[(0)])+(xi[(4)]))-((xi[(2)])+(xi[(6)])))*(c[2])))-(((((xr[(1)])+(xr[(5)]))-((xr[(3)])+(xr[(7)])))*(c[2]))-((((xi[(1)])+(xi[(5)]))-((xi[(3)])+(xi[(7)])))*(c[0])));$ $ysi[2]=(((((xr[(0)])+(xr[(4)]))-((xr[(2)])+(xr[(6)])))*(c[2]))+((((xi[(0)])+(xi[(4)]))-((xi[(2)])+(xi[(6)])))*(c[0])))+(((((xr[(1)])+(xr[(5)]))-((xr[(3)])+(xr[(7)])))*(c[0]))+((((xi[(1)])+(xi[(5)]))-((xi[(3)])+(xi[(7)])))*(c[2])));$ $ysr[2]=(((((xr[(0)])+(xr[(4)]))-((xr[(2)])+(xr[(6)])))*(c[0]))-((((xi[(0)])+(xi[(4)]))-((xi[(2)])+(xi[(6)])))*(c[2])))+(((((xr[(1)])+(xr[(5)]))-((xr[(3)])+(xr[(7)])))*(c[2]))-((((xi[(1)])+(xi[(5)]))-((xi[(3)])+(xi[(7)])))*(c[0])));$ $ysi[5]=(((((xr[(0)])-(xr[(4)]))*(c[2]))+(((xi[(0)])-(xi[(4)]))*(c[0])))+((((xr[(2)])-(xr[(6)]))*(c[0]))+(((xi[(2)])-(xi[(6)]))*(c[2]))))-(((((xr[(1)])-(xr[(5)]))*(c[1]))+(((xi[(1)])-(xi[(5)]))*(c[1]))+((((xr[(3)])-(xr[(7)]))*(c[1]))+(((xi[(3)])-(xi[(7)]))*(c[3])))); ysr[5]=(((((xr[(0)])-(xr[(4)]))*(c[0]))-(((xi[(0)])-(xi[(4)]))*(c[2])))+((((xr[(2)])-(xr[(6)]))*(c[2]))-(((xi[(2)])-(xi[(6)]))*(c[0]))))-(((((xr[(1)])-(xr[(5)]))*(c[1]))-(((xi[(1)])-(xi[(5)]))*(c[1])))+((((xr[(3)])-(xr[(7)]))*(c[3]))-(((xi[(3)])-(xi[(7)]))*(c[1])))); ysi[1]=(((((xr[(0)])-(xr[(4)]))*(c[2]))+(((xi[(0)])-(xi[(4)]))*(c[0])))+((((xr[(2)])-(xr[(6)]))*(c[0]))+(((xi[(2)])-(xi[(6)]))*(c[2]))))+(((((xr[(1)])-(xr[(5)]))*(c[1]))+(((xi[(1)])-(xi[(5)]))*(c[1])))+((((xr[(3)])-(xr[(7)]))*(c[1]))+(((xi[(3)])-(xi[(7)]))*(c[3])))); ysr[1]=(((((xr[(0)])-(xr[(4)]))*(c[0]))-(((xi[(0)])-(xi[(4)]))*(c[2])))+((((xr[(2)])-(xr[(6)]))*(c[2]))-(((xi[(2)])-(xi[(6)]))*(c[0]))))+(((((xr[(1)])-(xr[(5)]))*(c[1]))-(((xi[(1)])-(xi[(5)]))*(c[1])))+((((xr[(3)])-(xr[(7)]))*(c[3]))-(((xi[(3)])-(xi[(7)]))*(c[1]))));$ $ysi[7]=((((((xr[(0)])-(xr[(4)]))*(c[0]))-(((xi[(0)])-(xi[(4)]))*(c[2])))-((((xr[(2)])-(xr[(6)]))*(c[2]))-(((xi[(2)])-(xi[(6)]))*(c[0]))))*(c[2]))+((((((xr[(0)])-(xr[(4)]))*(c[2]))+(((xi[(0)])-(xi[(4)]))*(c[0])))-((((xr[(2)])-(xr[(6)]))*(c[0]))+(((xi[(2)])-(xi[(6)]))*(c[2]))))*(c[0])))-(((((((xr[(1)])-(xr[(5)]))*(c[1]))-(((xi[(1)])-(xi[(5)]))*(c[1])))-((((xr[(3)])-(xr[(7)]))*(c[3]))-(((xi[(3)])-(xi[(7)]))*(c[1]))))*(c[0]))+((((((xr[(1)])-(xr[(5)]))*(c[1]))+(((xi[(1)])-(xi[(5)]))*(c[1])))-((((xr[(3)])-(xr[(7)]))*(c[1]))+(((xi[(3)])-(xi[(7)]))*(c[3]))))*(c[2]))); ysr[7]=((((((xr[(0)])-(xr[(4)]))*(c[0]))-(((xi[(0)])-(xi[(4)]))*(c[2])))-((((xr[(2)])-(xr[(6)]))*(c[2]))-(((xi[(2)])-(xi[(6)]))*(c[0]))))*(c[0]))-(((((xr[(0)])-(xr[(4)]))*(c[2]))+(((xi[(0)])-(xi[(4)]))*(c[0])))-((((xr[(2)])-(xr[(6)]))*(c[0]))+(((xi[(2)])-(xi[(6)]))*(c[2]))))*(c[2])))-(((((((xr[(1)])-(xr[(5)]))*(c[1]))-(((xi[(1)])-(xi[(5)]))*(c[1])))-((((xr[(3)])-(xr[(7)]))*(c[3]))-(((xi[(3)])-(xi[(7)]))*(c[1]))))*(c[2]))-((((((xr[(1)])-(xr[(5)]))*(c[1]))+(((xi[(1)])-(xi[(5)]))*(c[1])))-((((xr[(3)])-(xr[(7)]))*(c[1]))+(((xi[(3)])-(xi[(7)]))*(c[3]))))*(c[0]))); ysi[3]=((((((xr[(0)])-(xr[(4)]))*(c[0]))-(((xi[(0)])-(xi[(4)]))*(c[2])))-((((xr[(2)])-(xr[(6)]))*(c[2]))..(((xi[(2)])-(xi[(6)]))*(c[0]))))*(c[2]))+((((((xr[(0)])-(xr[(4)]))*(c[2]))+(((xi[(0)])-(xi[(4)]))*(c[0])))-((((xr[(2)])-(xr[(6)]))*(c[0]))+(((xi[(2)])-(xi[(6)]))*(c[2]))))*(c[0])))+(((((((xr[(1)])-(xr[(5)]))*(c[1]))-(((xi[(1)])-(xi[(5)]))*(c[1])))-((((xr[(3)])-(xr[(7)]))*(c[3]))-(((xi[(3)])-(xi[(7)]))*(c[1]))))*(c[0]))+((((((xr[(1)])-(xr[(5)]))*(c[1]))+(((xi[(1)])-(xi[(5)]))*(c[1])))-((((xr[(3)])-(xr[(7)]))*(c[1]))+(((xi[(3)])-(xi[(7)]))*(c[3]))))*(c[2]))); ysr[3]=((((((xr[(0)])-(xr[(4)]))*(c[0]))-(((xi[(0)])-(xi[(4)]))*(c[2])))-((((xr[(2)])-(xr[(6)]))*(c[2]))-(((xi[(2)])-(xi[(6)]))*(c[0]))))*(c[0]))-(((((xr[(0)])-(xr[(4)]))*(c[2]))+(((xi[(0)])-(xi[(4)]))*(c[0])))-((((xr[(2)])-(xr[(6)]))*(c[0]))+(((xi[(2)])-(xi[(6)]))*(c$

[2])))+((((((((xr[(1)])−(xr[(5)]))*(c[1]))−(((xi[(1)])−(xi[(5)]))*(c[1])))−((((xr[(3)])−(xr[(7)]))*(c[3]))−(((xi[(3)])−(xi[(7)]))*(c[1]))))*(c[2]))−(((((xr[(1)])−(xr[(5)]))*(c[1]))+(((xi[(1)])−(xi[(5)]))*(c[1])))−((((xr[(3)])−(xr[(7)]))* (c[1]))+(((xi[(3)])−(xi[(7)]))*(c[3]))))*(c[0])));

"Differences"
For[i=0, i<=M−1, i++,
   Print[Simplify[ytr[i]−ysr[i]]]
   Print[Simplify[yti[i]−ysi[i]]]
]
0
0
0
0
0
0
0
0
0
0
0
0
0
0
0

The present algorithm thus provides a method for verifying that a system hierarchically built from smaller blocks or components correctly implements a desired equation representative of the system. FIG. 3 is a flow chart illustrating an exemplary embodiment of the present algorithm 20 or method 20. In particular, the algorithm 20 comprises the following steps.

An equation (string variable) is written 21 for each component of the system in terms of its inputs and outputs that represents the operation executed by each component. The respective equations are mathematically linked together 22 according to the system hierarchy. A symbolic test vector is then input 23 or applied 23 to the mathematically linked equations. The symbolic test vector is clocked 24 through the system (processed by each of the equations) and the resulting symbolic equation generated at the output of the final equation and is recorded 25. The symbolic equation is then compared 26 with the desired equation for the system using a symbolic manipulation tool. Thus, if the comparison generates a zero difference, the system correctly implements the desired equation representative of the system, and vice-versa.

Using the symbolic approach of the present invention only requires use of a single symbolic test vector to exhaustively test all possible inputs to the system. Furthermore, if the system produces an incorrect equation at the output, by comparing the terms of the resulting symbolic equation generated at the output with the desired equation, errors can be found in the design.

Thus, an architectural equation generating algorithm or method for testing whether a system hierarchically that is built from smaller blocks correctly implements a desired equation has been disclosed. It is to be understood that the described embodiment is merely illustrative of some of the many specific embodiments that represent applications of the principles of the present invention. Clearly, numerous and other arrangements can be readily devised by those skilled in the art without departing from the scope of the invention.

What is claimed is:

1. A method for verifying that a system is hierarchically built from smaller components correctly implements a desired equation representative of the system, said method comprising the steps of:

writing an equation for each component of the system in terms of its inputs and outputs that represents the operation executed by each component;

mathematically linking the respective equations together according to the system hierarchy;

applying a symbolic test vector to the mathematically linked equations;

clocking the symbolic test vector through the mathematically linked equations to generate a symbolic equation at the output thereof;

recording the symbolic equation generated at the output of the mathematically linked equations; and comparing the symbolic equation with an equation that correctly represents the system using a symbolic manipulation tool;

obtaining an indication of proper implementation of each of said components of said system from the step of comparing; and wherein if the comparison generates a zero difference, the system correctly implements the desired equation representative of the system, and vice-versa.

\* \* \* \* \*